(12) United States Patent
Liu et al.

(10) Patent No.: US 12,161,032 B2
(45) Date of Patent: Dec. 3, 2024

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Hongyan Liu, Wuhan (CN); Feixiang Sun, Wuhan (CN)

(73) Assignee: WUHAN CHINA STAR OPTOELECTRICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 397 days.

(21) Appl. No.: 17/771,481

(22) PCT Filed: Mar. 17, 2022

(86) PCT No.: PCT/CN2022/081418
§ 371 (c)(1),
(2) Date: Apr. 24, 2022

(87) PCT Pub. No.: WO2023/164980
PCT Pub. Date: Sep. 7, 2023

(65) Prior Publication Data
US 2023/0284488 A1  Sep. 7, 2023

(51) Int. Cl.
*H10K 59/131* (2023.01)
(52) U.S. Cl.
CPC .................. *H10K 59/131* (2023.02)

(58) Field of Classification Search
CPC .... H10K 59/131; H10K 59/12; H10K 59/122; H10K 59/179; G06F 3/0446; H01L 27/124; H01L 27/156; H01L 27/1214
See application file for complete search history.

(56) References Cited

U.S. PATENT DOCUMENTS

| 9,691,791 B2 * | 6/2017 | Jeon .......................... G09G 3/20 |
| 2006/0114193 A1 | 6/2006 | Kwak et al. |

(Continued)

FOREIGN PATENT DOCUMENTS

| CN | 108732837 A | * 11/2018 | ......... G02F 1/13338 |
| CN | 109634467 A | 4/2019 | |

(Continued)

OTHER PUBLICATIONS

PCT International Search Report for International Application No. PCT/CN2022/081418, mailed on Nov. 25, 2022, 10pp.

(Continued)

*Primary Examiner* — Douglas W Owens
(74) *Attorney, Agent, or Firm* — The Roy Gross Law Firm, LLC; Roy Gross

(57) ABSTRACT

The present application discloses a display panel in which a second data line in a display area is located between a first data line and a third data line, and a spacing between the first data line and the second data line is less than a spacing between the third data line and the second data line. A second pad is located between a first pad and a third pad in a direction perpendicular to the display area pointing to a binding area, the first pad is electrically connected to the first data line, the second pad is electrically connected to the third data line, and the third pad is electrically connected to the second data line.

20 Claims, 8 Drawing Sheets

(56) References Cited

U.S. PATENT DOCUMENTS

2017/0169760 A1* 6/2017 Kim .................... H10K 59/351
2019/0207163 A1* 7/2019 Paek .................... H10K 59/122

FOREIGN PATENT DOCUMENTS

| CN | 110459561 A | 11/2019 |
| CN | 111913318 A | 11/2020 |
| CN | 113096601 A | 7/2021 |

OTHER PUBLICATIONS

PCT Written Opinion of the International Search Authority for International Application No. PCT/CN2022/081418, mailed on Nov. 25, 2022, 9pp.

* cited by examiner

DISPLAY PANEL

CROSS REFERENCE TO RELATED APPLICATIONS

This application is a National Phase of PCT Patent Application No. PCT/CN2022/081418 having International filing date of Mar. 17, 2022, which claims the benefit of priority of Chinese Patent Application No. 202210208967.3, filed Mar. 4, 2022, the contents of which are all incorporated herein by reference in their entirety.

TECHNICAL FIELD

The present application relates to a technical field of display, and in particular, to a display panel.

BACKGROUND

At present, when a plurality of data lines are disposed at unequal intervals in a display area of a display panel, a parasitic capacitance between two data lines that are close to each other is inconsistent with a parasitic capacitance between two data lines that are far away, which will affect display effects of a display panel.

Therefore, it is necessary to provide a technical solution to solve a problem that inconsistency of parasitic capacitances between data lines affecting display effects.

Technical Problem

The present application aims to provide a display panel to solve a problem that inconsistency of parasitic capacitances among a plurality of data lines affecting display effects.

Technical Solutions

Provided is a display panel, the display panel has a display area and a binding area, and the display panel comprises:
 a first data line extending from the display area to the binding area and being electrically connected to a first column of sub-pixels of the display area;
 a second data line extending from the display area to the binding area, being located on one side of the first data line and being electrically connected to a second column of sub-pixels of the display area, wherein the second column of sub-pixels is located on one side of the first column of sub-pixels;
 a third data line extending from the display area to the binding area and being electrically connected to a third column of sub-pixels of the display area, wherein the second column of sub-pixels is located between the first column of sub-pixels and the third column of sub-pixels, the second data line is located between the first data line and the third data line in the display area, and a spacing between the first data line and the second data line is less than a spacing between the third data line and the second data line;
 a first pad disposed in the binding area and located on one side of the second data line and the third data line close to the first data line, the first pad is electrically connected to the first data line;
 a second pad disposed in the binding area and electrically connected to the third data line;
 a third pad disposed in the binding area and electrically connected to the second data line, and the second pad is located between the first pad and the third pad in a direction perpendicular to the display area pointing to the binding area; and
 a source driver chip connected to the first pad, the second pad, and the third pad.

Technical Effects

The present application discloses a display panel. In a display area of the display panel, a second data line is located between a first data line and a third data line, and a spacing between the first data line and the second data line is less than a spacing between the third data line and the second data line. Furthermore, a first pad is located on one side of the second data line and the third data line close to the first data line, the first pad is electrically connected to the first data line, a second pad is located between the first pad and a third pad in a direction perpendicular to the display area pointing to the binding area, the first pad is electrically connected to the first data line, the second pad is electrically connected to the third data line, and the third pad is electrically connected to the second data line, so that a spacing between the first data line and the second data line in an area between the display area and the binding area is increased and a spacing between the second data line and the third data line is decreased, and therefore a parasitic capacitance between the first data line and the second data line and a parasitic capacitance between the second data line and the third data line tend to be consistent.

DETAILED DESCRIPTION

Hereinafter, technical solution in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

Figure 1:
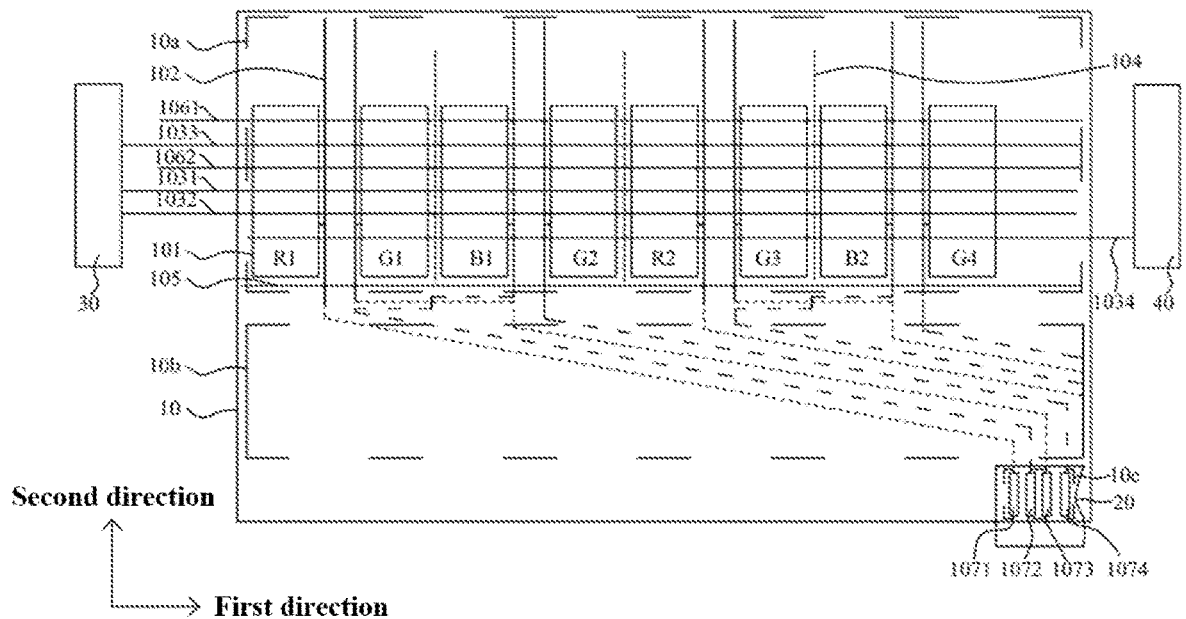
FIG. 1 is a schematic diagram of a display panel according to an embodiment of the present application.

Referring to FIG. 1, the present application provides a display device 50. The display device 50 may be any one of a liquid crystal display device, an organic light emitting diode display device, a micro light emitting diode display device, and a sub-millimeter light emitting diode display device. Specifically, the display device 50 is an organic light emitting diode display device.

The display device 50 comprises a display panel 10, a source driver chip 20, a gate driver circuit 30, and a light-emitting control driver circuit 40.

The display panel 10 has a display area 10*a*, a sector 10*b* and a binding area 10*c*. The sector 10*b* is located between the display area 10*a* and the binding area 10*c* in a second direction, and the second direction is a direction from the display area 10*a* to the binding area 10*c*.

The display panel 10 comprises a plurality of sub-pixels 101, a plurality of data lines 102, a first scanning signal line 1031, a second scanning signal line 1032, a third scanning signal line 1033, a light-emitting control signal line 1034, a first power supply voltage line 104, a second power supply voltage line 105, a first initialization voltage line 1061, a second initialization voltage line 1062, and a plurality of pads.

A plurality of sub-pixels 101 are arrayed in a display area 10*a* of the display panel along a row direction (first direction) and a column direction (second direction). The plurality of sub-pixels 101 comprise red sub-pixels, blue sub-pixels, and green sub-pixels, which are disposed in Pentile RGB.

The plurality of pixels 101 comprise a first red sub-pixel R1, a first green sub-pixel G1, a first blue sub-pixel B1, a second green sub-pixel G2, a second red sub-pixel R2, a third green sub-pixel G3, a second blue sub-pixel B2, and a fourth green sub-pixel G4 which are disposed in sequence along the first direction in the same row, and the first direction is perpendicular to the second direction. The first red sub-pixel R1, the first green sub-pixel G1, the first blue sub-pixel B1, and the second green sub-pixel G2 serve as a repeating unit, the second red sub-pixel R2, the third green sub-pixel G3, the second blue sub-pixel B2, and the fourth green sub-pixel G4 serve as another repeating unit, and a plurality of repeating units are repeatedly disposed in the row direction.

It can be understood that the red sub-pixels, the blue sub-pixels, and the green sub-pixels may be disposed in a standard RGB, and a plurality of sub-pixels 101 may further comprise white sub-pixels.

The first scanning signal line 1031, the second scanning signal line 1032, the third scanning signal line 1033, the light-emitting control signal line 1034, the first initialization voltage line 1061, and the second initialization voltage line 1062 are disposed in the display area 10*a* and extend along the first direction. One first scanning signal line 1031, one second scanning signal line 1032, one third scanning signal line 1033, one light-emitting control signal line 1034, one first initialization voltage line 1061, and one second initialization voltage line 1062 pass through one row of sub-pixels 101 in the row direction.

The gate driver circuit 30 is electrically connected to the first scanning signal line 1031, the second scanning signal line 1032, and the third scanning signal line 1033. The gate driver circuit 30 outputs a first scanning signal Pscan (n), a second scanning signal Nscan (n) and a third scanning signal Nscan (n+1) to the first scanning signal line 1031, the second scanning signal line 1032, and the third scanning signal line 1033, respectively.

The light-emitting control driver circuit 40 is connected to the light-emitting control signal line 1034, and outputs a light-emitting control signal EM to the light-emitting control signal line 1034.

The first initialization voltage line 1061 and the second initialization voltage line 1062 may obtain corresponding signals from an external voltage source. The first initialization voltage line 1061 is used to transmit a first initialization voltage Vi1. The second initialization voltage line 1062 is used to transmit a second initialization voltage Vi2.

A plurality of the first power supply voltage lines 104 are disposed in the display area 10*a* and extend along the second direction, and one of first power supply voltage lines 104 is disposed between two adjacent data lines 102. The second power supply voltage line 105 is located in the display area 10*a* and disposed along an edge of the display area 10*a*.

The first power supply voltage lines 104 and the second power supply voltage lines 105 may obtain corresponding signals from an external voltage source. The first power supply voltage line 104 is configured to transmit a first power supply voltage VDD, which is a predetermined high-level voltage. The second power supply voltage line 105 is used to transmit a second power supply voltage VSS, which is a predetermined low-level voltage.

A plurality of pads are disposed side by side in the binding area 10*c* along the first direction. The source driver chip 20 is bound to the plurality of pads, and the plurality of pads are electrically connected to the plurality of data lines 102 one to one. The source driver chip 20 outputs a data signal DATA to the plurality of data lines 102 through the plurality of pads.

The plurality of pads comprise a first pad 1071, a second pad 1072, a third pad 1073, and a fourth pad 1074. The second pad 1072 is located between the first pad 1071 and the third pad 1073. The fourth pad 1074 is located on one side of the third pad 1073 away from the second pad 1072.

Figure 2:
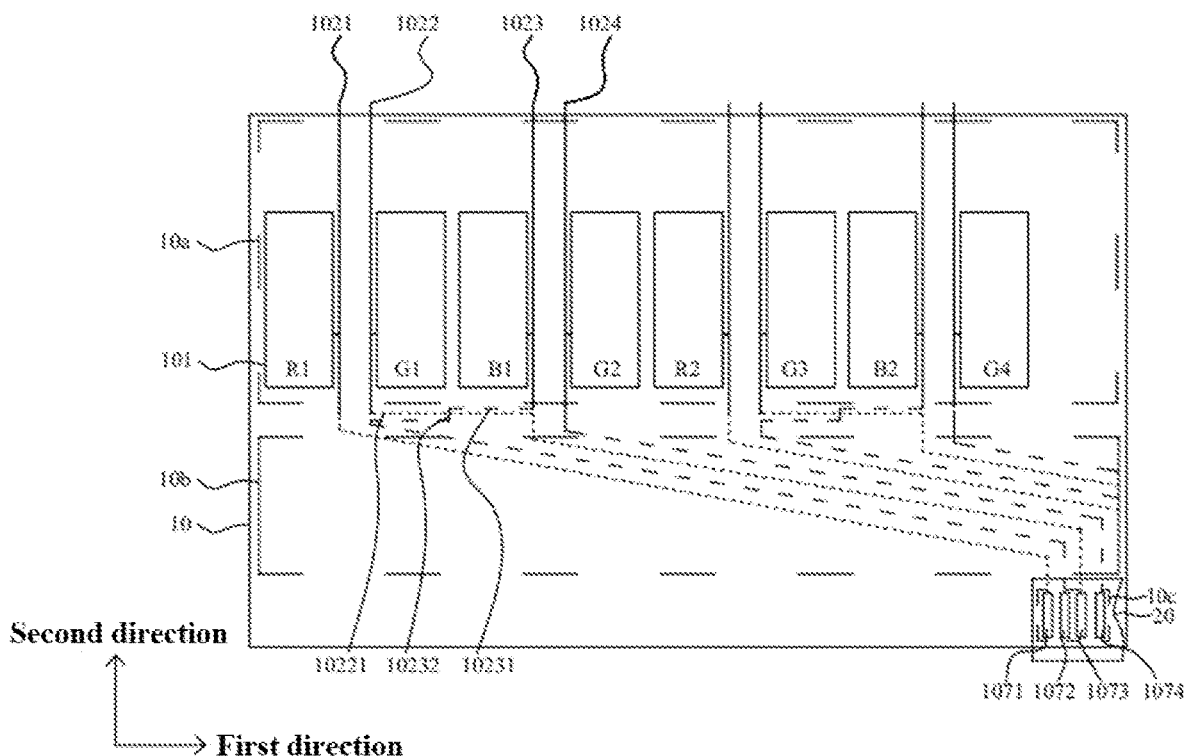
FIG. 2 is a partial plan view of the display panel shown in FIG. 1.

Referring to FIG. 2, the plurality of data lines 102 extend from the display area 10*a* through the sector region 10*b* along the second direction to be electrically connected to the plurality of pads of the binding area 10*c*, and the plurality of data lines 102 are insulated from each other. The plurality of data lines 102 comprises a first data line 1021, a second data line 1022, a third data line 1023, and a fourth data line 1024. The second data line 1022 and the third data line 1023 are located between the first data line 1021 and the fourth data line 1024. The first pad 1071 is located on one side of the second data line 1022 and the third data line 1023 close to the first data line 1021.

In the display area 10*a*, the second data line 1022 is located between the first data line 1021 and the third data line 1023, the fourth data line 1024 is located on one side of the second data line 1022 and the third data line 1023 away from the first data line 1021, and a spacing between the fourth data line 1024 and the third data line 1023 is equal to a spacing between the first data line 1021 and the second data line 1022.

In the display area 10*a*, the first data line 1021 is electrically connected to a first column of sub-pixels of the display area 10*a*, the second data line 1022 is electrically connected to a second column of sub-pixels of the display area 10*a*, the third data line 1023 is electrically connected to a third column of sub-pixels of the display area 10*a*, and the fourth data line 1024 is electrically connected to a fourth column of sub-pixels of the display area 10*a*, the second column of sub-pixels is located between the first column of sub-pixels and the third column of sub-pixels, and the fourth column of sub-pixels is located on one side of the third column of sub-pixels away from the second column. The first column of sub-pixels comprises a first red sub-pixel R1, the second column of sub-pixels comprises a first green sub-pixel G1, the third column of sub-pixels comprises a first blue sub-pixel B1, and the fourth column of sub-pixels comprises a second green sub-pixel G2.

Figure 3:
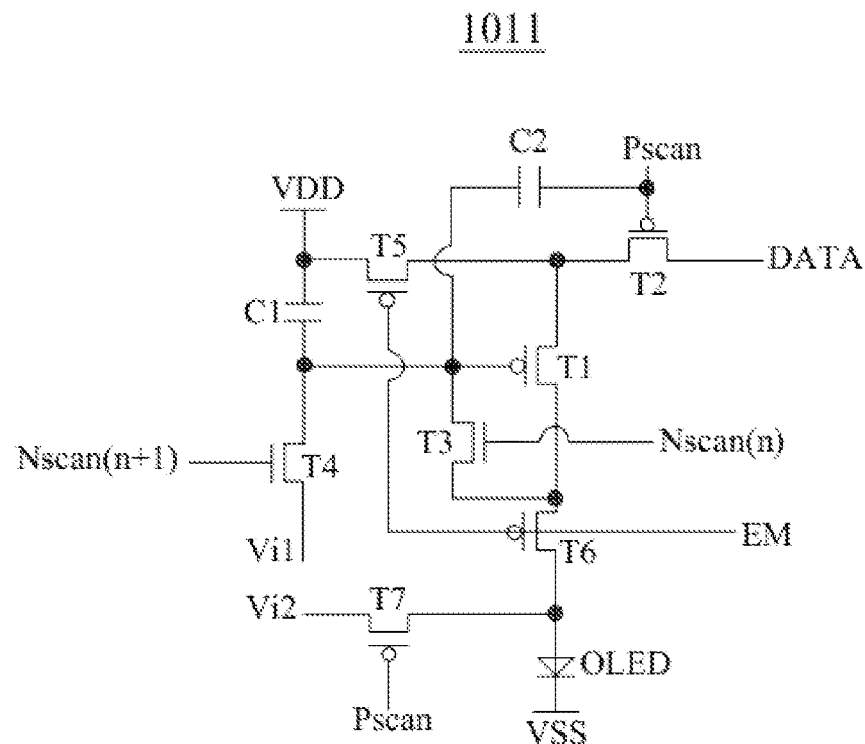
FIG. 3 is a schematic diagram of a pixel circuit of a sub-pixel of the display panel shown in FIG. 1.

Referring to FIG. 3, each sub-pixel 101 comprises a pixel circuit 1011, and each pixel circuit 1011 comprises an organic light-emitting diode OLED, a plurality of transistors T1 to T7, and capacitors C1 to C2. One pixel circuit 1011 is input with a data signal DATA, a first scanning signal Pscan, a second scanning signal Nscan (n), a third scanning signal Nscan (n+1), a light-emitting control signal EM, a first power supply voltage VDD, a second power supply voltage VSS, a first initialization voltage Vi1, and a second initialization voltage Vi2.

An organic light-emitting diode OLED comprises an anode, a cathode, and an organic light-emitting layer located between the anode and the cathode. The cathode of the organic light-emitting diode OLED is connected to the second power supply voltage VSS.

The first capacitor C1 comprises a first electrode plate and a second electrode plate. The first electrode plate of the first capacitor C1 is connected to a gate of the first transistor T1, a first electrode of the third transistor T3, and a first electrode of the fourth transistor T4. The second electrode plate of the first capacitor C1 is connected to the first power supply voltage VDD.

The second capacitor C2 comprises a third electrode plate and a fourth electrode plate. The third electrode plate of the second capacitor C2 is connected to the gate of the first transistor T1, the first electrode of the third transistor T3, and the first electrode of the fourth transistor T4. The fourth electrode plate of the second capacitor C2 is connected to the first scanning signal Pscan.

Each of the plurality of transistors T1 to T7 comprises a gate, a first electrode, and a second electrode. The first electrode of the plurality of transistors T1 to T7 is one of source or drain, and the second electrode of the plurality of transistors T1 to T7 is the other of source and drain.

The plurality of transistors T1 to T7 are all thin film transistors. Each of the transistors T1 to T7 may be any one of PMOS transistors and NMOS transistors, and an active layer of each of the transistors T1 to T7 is any one of polysilicon and metal oxide.

Specifically, the first transistor T1, the second transistor T2, the fifth transistor T5, the sixth transistor T6, and the seventh transistor T7 are all PMOS transistors. The active layers of the first transistor T1, the second transistor T2, the fifth transistor T5, the sixth transistor T6, and the seventh transistor T7 are all located in a first semiconductor layer, and the first semiconductor layer is a low-temperature polysilicon active layer. Both the third transistor T3 and the fourth transistor T4 are NMOS transistors, and the active layers of the third transistor T3 and the fourth transistor T4 are located in a second semiconductor layer, and the second semiconductor layer is a metal oxide active layer.

It should be noted that characteristics of the PMOS transistors and the NMOS transistors are different from each other. The third transistor T3 and the fourth transistor T4 are formed of an NMOS transistor with relatively good turn-off characteristics, so that leakage of driving current can be reduced during light-emitting period of the organic light emitting diode OLED.

The gate of the first transistor T1 is connected to the first electrode plate of the first capacitor C1, the third electrode plate of the second capacitor C2, the first electrode of the third transistor T3, and the first electrode of the fourth transistor T4. The first electrode of the first transistor T1 is connected to the first supply voltage VDD through the fifth transistor T5, and the first electrode of the first transistor T1 is connected to the data signal DATA through the second transistor T2. The second electrode of the first transistor T1 is connected to an anode of the organic light-emitting diode OLED through the sixth transistor T6. The first transistor T1 receives the data signal DATA according to a switching operation of the second transistor T2, and supplies a driving current to the organic light-emitting diode OLED.

The gate of the second transistor T2 is connected to the first scanning signal Pscan. The first electrode of the second transistor T2 is connected to the data signal DATA. The second electrode of the second transistor T2 is connected to the first electrode of the first transistor T1, and the second electrode of the second transistor T2 is connected to the first supply voltage VDD through the fifth transistor T5. The second transistor T2 is turned on in response to the first scanning signal Pscan to perform a switching operation of transmitting the data signal DATA to the first electrode of the first transistor T1.

The gate of the third transistor T3 is connected to the second scanning signal Nscan (n). The first electrode of the third transistor T3 is connected to the first electrode of the fourth transistor T4 and the gate of the first transistor T1, and the second electrode of the third transistor T3 is connected to the second electrode of the first transistor T1 and the first electrode of the sixth transistor T6. The third transistor T3 is turned on in response to the second scanning signal Nscan (n) to connect the gate and the second electrode of the first transistor T1, thereby diode-connecting the first transistor T1. A voltage difference is generated between the gate electrode of the first transistor T1 and the second electrode by a threshold voltage of the first transistor T1, and a data signal DATA having a compensated threshold voltage is supplied to the gate of the first transistor T1, thereby compensating threshold voltage deviation of the first transistor T1.

The gate of the fourth transistor T4 is connected to the third scanning signal Nscan (n+1). The first electrode of the fourth transistor T4 is connected to the gate of the first transistor T1, the first electrode plate of the first capacitor C1, the third electrode plate of the second capacitor C2, and the first electrode of the third transistor T3. The second electrode of the fourth transistor T4 is connected to the first initialization voltage Vi1. The fourth transistor T4 is turned on in response to the third scanning signal Nscan (n+1) to output the first initialization voltage Vi1 to the gate of the first transistor T1 to perform an operation of initializing voltage of the gate of the first transistor T1.

The gate of the fifth transistor T5 is connected to the light-emitting control signal EM, the first electrode of the fifth transistor T5 is connected to the first supply voltage VDD, and the second electrode of the fifth transistor T5 is connected to the first electrode of the first transistor T1 and the second electrode of the second transistor T2.

The gate of the sixth transistor T6 is connected to the light-emitting control signal EM, the first electrode of the sixth transistor T6 is connected to the second electrode of the first transistor T1 and the second electrode of the third transistor T3, and the second electrode of the sixth transistor T6 is connected to an anode of the organic light emitting diode OLED and the first electrode of the seventh transistor T7.

The gate of the seventh transistor T7 is connected to the first scanning signal Pscan, the first electrode of the seventh transistor T7 is connected to an anode of the organic light-emitting diode OLED and the second electrode of the sixth transistor T6, and the second electrode of the seventh transistor T7 is connected to the second initialization voltage Vi2. The seventh transistor T7 is turned on in response to the first scanning signal Pscan to transmit the first scanning signal Pscan to the anode of the organic light-emitting diode OLED, thereby realizing initialization of the anode of the organic light-emitting diode OLED.

Figure 4:
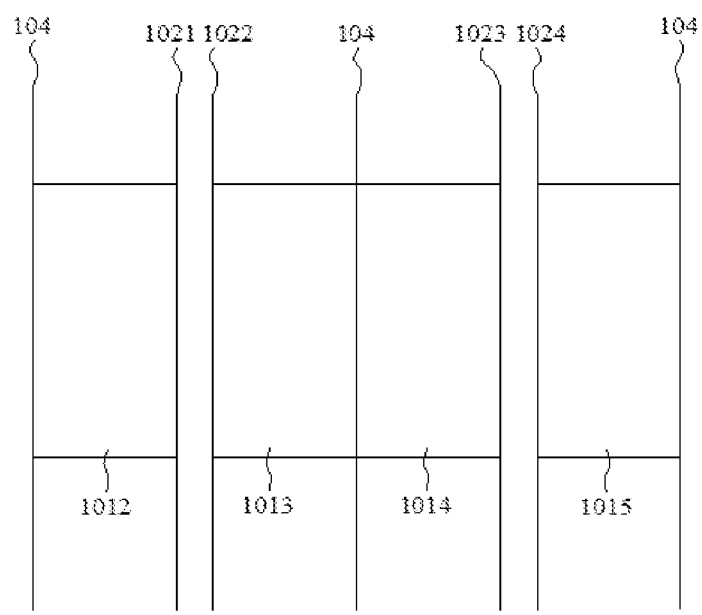
FIG. 4 is a schematic diagram of connection between a pixel circuit of a sub-pixel and a data line of the display panel shown in FIG. 2.

Referring to FIG. 4, the first red sub-pixel R1 comprises a first pixel circuit 1012, and the first pixel circuit 1012 is electrically connected to the first data line 1021. The first green sub-pixel G1 comprises a second pixel circuit 1013, and the second pixel circuit 1013 is electrically connected to the second data line 1022. The first blue sub-pixel B1 comprises a third pixel circuit 1014, and the third pixel circuit 1014 is electrically connected to the third data line 1023. The second green sub-pixel G2 comprises a fourth pixel circuit 1015, and the fourth pixel circuit 1015 is electrically connected to the fourth data line 1024.

In the display area 10a, at least a portion of the first pixel circuit 1012 is located on one side of the first data line 1021 away from the second data line 1022, at least a portion of the second pixel circuit 1013 and at least a portion of the third pixel circuit 1014 are located between the second data line 1022 and the third data line 1023, and at least a portion of the fourth pixel circuit 1015 is located on one side of the fourth data line 1024 away from the third data line 1023.

Specifically, the first pixel circuit 1012 is divided into a first portion and a second portion. An area occupied by the second portion of the first pixel circuit 1012 is greater than an area occupied by the first portion of the first pixel circuit 1012. The first portion of the first pixel circuit 1012 overlaps the first data line 1021. The second portion of the first pixel circuit 1012 is located on one side of the first data line 1021 away from the second data line 1022. Therefore, the first pixel circuit 1012 is mainly located on one side of the first data line 1021 away from the second data line 1022.

The second pixel circuit 1013 is also divided into a first portion and a second portion. An area occupied by the second portion of the second pixel circuit 1013 is greater than an area occupied by the first portion of the second pixel circuit 1013, the first portion of the first pixel circuit 1012 is the same as the first portion of the second pixel circuit 1013, and the second portion of the second pixel circuit 1013 is the same as the second portion of the first pixel circuit 1012. A first portion of the second pixel circuit 1013 overlaps the second data line 1022, and the second portion of the second pixel circuit 1013 is located on one side of the second data line 1022 away from the first data line 1021. The first pixel circuit 1012 and the second pixel circuit 1013 are disposed symmetrically about a center line between the first data line 1021 and the second data line 1022.

The third pixel circuit 1014 is also divided into a first portion and a second portion. The first portion of the third pixel circuit 1014 is the same as the first portion of the second pixel circuit 1013, the second portion of the third pixel circuit 1014 is the same as the second portion of the second pixel circuit 1013, and an area occupied by the second portion of the third pixel circuit 1014 is greater than an area occupied by the first portion of the third pixel circuit 1014. The first portion of the third pixel circuit 1014 is disposed to overlap the third data line 1023, and the second portion of the third pixel circuit 1014 is disposed adjacent to the second portion of the second pixel circuit 1013 and disposed between the second data line 1022 and the third data line 1023. The second pixel circuit 1013 and the third pixel circuit 1014 are disposed symmetrically about a center line between the second data line 1022 and the third data line 1023. The second pixel circuit 1013 and the third pixel circuit 1014 share a first power supply voltage line 104, and the second pixel circuit 1013 and the third pixel circuit 1014 share a first power supply voltage line 104 located between the second data line 1022 and the third data line 1023.

The fourth pixel circuit 1015 is also divided into a first portion and a second portion. An area occupied by the second portion of the fourth pixel circuit 1015 is greater than an area occupied by the first portion of the fourth pixel circuit 1015. The first portion of the fourth pixel circuit 1015 is the same as the first portion of the third pixel circuit 1014, and the second portion of the fourth pixel circuit 1015 is the same as the second portion of the third pixel circuit 1014. A first portion of the fourth pixel circuit 1015 is disposed to overlap the fourth data line 1024, and a second portion of the fourth pixel circuit 1015 is located on one side of the fourth data line 1024 away from the third data line 1023. The fourth pixel circuit 1015 and the third pixel circuit 1014 are disposed symmetrically about a center line between the third data line 1023 and the fourth data line 1024.

Since each pixel circuit 1011 comprises a P-type transistor and an N-type transistor, two different types of scanning signals need to be input to the P-type transistor and the N-type transistor, which results in a complex trace in each pixel circuit, and space required for multiple pixel circuit arrangements is reduced by a mirror symmetrical arrangement between adjacent pixel circuits.

It can be understood that all portions of one second pixel circuit 1013 and all portions of one third pixel circuit 1014 may also be located between the second data line 1022 and the third data line 1023, and all portions of a first pixel circuit 1012 are located on one side of the first data line 1021 away from the second data line 1022, and all portions of one fourth pixel circuit 1015 are located on one side of the fourth data line 1024 away from the third data line 1023.

Due to arrangement of the pixel circuits and the data lines as shown in FIG. 4, a spacing between the first data line 1021 and the second data line 1022 in the display area is less than a spacing between the third data line 1023 and the second data line 1022, and a spacing between the fourth data line 1024 and the third data line 1023 is less than a spacing between the third data line 1023 and the second data line 1022.

The spacing between the first data line 1021 and the second data line 1022 is different from the spacing between the third data line 1023 and the second data line 1022, and the spacing between the third data line 1023 and the second data line 1022 is different from the spacing between the fourth data line 1024 and the third data line 1023, resulting in that parasitic capacitances between the first data line 1021 and the second data line 1022 are different from parasitic capacitances between the third data line 1023 and the second data line 1022. Further, parasitic capacitances between the third data line 1023 and the second data line 1022 are different from parasitic capacitances between the fourth data line 1024 and the third data line 1023. That is, parasitic capacitances between adjacent data lines are inconsistent, which affects display effects of the display panel.

In view of the problem of inconsistent parasitic capacitances between adjacent data lines, in the present application, the first data line 1021 is electrically connected to the first pad 1071, the second pad 1072 is electrically connected to the third data line 1023, the third pad 1073 is electrically connected to the second data line 1022, and the fourth pad 1074 is electrically connected to the fourth data line 1024, so as to facilitate that the spacing between the first data line 1021 and the second data line 1022 in an area between the display area 10a and the binding area 10c is greater than the spacing between the second data line 1022 and the third data line 1023, and the spacing between the fourth data line 1024 and the third data line 1023 is greater than the spacing between the third data line 1023 and the second data line 1022, so that the parasitic capacitances between the first data line 1021 and the second data line 1022, the parasitic capacitances between the second data line 1022 and the third data line 1023, and the parasitic capacitances between the third data line 1023 and the fourth data line 1024 tend to be consistent, thereby ensuring display effects of the display panel.

Specifically, as shown in FIG. 2, the third data line 1023 intersects with the second data line 1022 in an area between the sector 10b and the display area 10a, and the third data line 1023 in the sector 10b is located between the second data line 1022 and the first data line 1021, so that the second pad 1072 is electrically connected to the third data line 1023, and the third pad 1073 is electrically connected to the second data line 1022, thus the spacing between the first data line 1021 and the second data line 1022 in the sector 10b is greater than the spacing between the second data line 1022 and the third data line 1023, and the spacing between the third data line 1023 and the fourth data line 1024 is greater than the spacing between the third data line 1023 and the second data line 1022.

In the sector 10b, the spacing between the first data line 1021 and the third data line 1023, the spacing between the third data line 1023 and the second data line 1022, and the spacing between the second data line 1022 and the fourth data line 1024 are equal to each other.

In an area between the display area 10a and the sector area 10b, one of the second data line 1022 and the third data line 1023 comprises a first trace section 10231 and a second trace section 10232, the second trace section 10232 and the first trace section 10231 are located in different metal layers and are electrically connected, the other of the second data line 1022 and the third data line 1023 comprises a third trace section 10221, the third trace section 10221 and the second trace section 10232 are located in different metal layers, and the third trace section 10221 and the second trace section 10232 are electrically insulated and intersected. In a thickness direction of the display panel 10, the second trace section 10232 and the third trace section 10221 are respectively located on opposite sides of the first trace section 10231, so as to minimize parasitic capacitance formed by front intersection between the second trace section 10232 and the third trace section 10221, and avoid a problem of uneven display caused by too large parasitic capacitance due to front intersection.

Specifically, the second data line 1022 comprises a third trace section 10221 extending in a direction away from the first data line 1021, and the third trace section 10221 is parallel to the first direction. The third data line 1023 comprises a first trace section 10231 and a second trace section 10232 which are located in different metal layers and are electrically connected. The third trace section 10221 and the second trace section 10232 are respectively located on opposite sides of the first trace section 10231. The first trace section 10231 extends in a direction close to the first data line 1021. The first trace section 10231 is parallel to the first direction, and the second trace section 10232 is parallel to the second direction.

It can be understood that the second data line 1022 may also comprise a first trace section 10231 and a second trace section 10232 located in different metal layers and electrically connected, and the third data line 1023 comprises a third trace section 10221.

The display panel further comprises a substrate 11, and the third trace section 10221 is located between the first trace section 10231 and the substrate 11.

In the thickness direction of the display panel 10, the first data line 1021 and the second data line 1022 in the sector 10b are located in the same layer and are made of the same material, and the third data line 1023 and the fourth data line 1024 in the sector 10b are located in the same layer and are made of the same material, so as to facilitate arrangement of wirings in the sector 10b using different metal layers, thus reducing risk of forming short circuit between the data lines in the sector 10b.

In the display area 10a, the first data line 1021, the second data line 1022, the third data line 1023, and the fourth data line 1024 are disposed in the same layer and are made of the same material, so as to simplify the manufacturing process.

In the thickness direction of the display panel 10, the first data line 1021, the second data line 1022, the third data line 1023, and the fourth data line 1024 in the display area 10a are located on one side of the second trace section 10232 away from the substrate 11.

Figure 5:
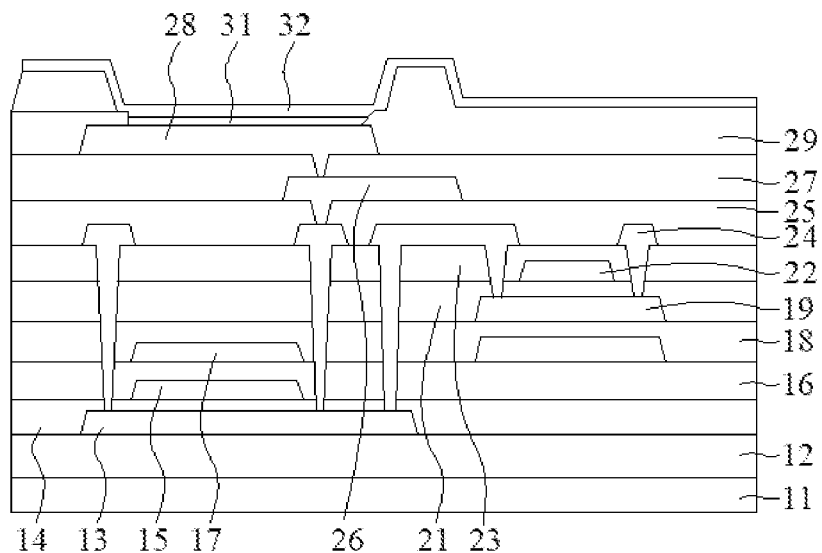
FIG. 5 is a schematic cross-sectional view of the display panel shown in FIG. 1.

As shown in FIG. 5, the display panel 10 comprises a substrate 11, a buffer layer 12, a first semiconductor layer 13, a first insulating layer 14, a first conductive layer 15, a second insulating layer 16, a second conductive layer 17, a third insulating layer 18, a second semiconductor layer 19, a fourth insulating layer 21, a third conductive layer 22, a fifth insulating layer 23, a fourth conductive layer 24, a first planarization layer 25, a fifth conductive layer 26, a second planarization layer 27, a first electrode layer 28, a pixel definition layer 29, an organic light-emitting layer 31, and a second electrode layer 32, which are sequentially stacked.

All of the buffer layer 12, the first insulating layer 14, the second insulating layer 16, the third insulating layer 18, the fourth insulating layer 21, and the fifth insulating layer 23 have an inorganic film layer, and both the first planarization layer 25 and the second planarization layer 27 have an organic film layer with a thickness of 1 micron to 3 microns.

The first data line 1021, the second data line 1022, the third data line 1023, and the fourth data line 1024 in the display area 10a are all located in the fifth conductive layer 26. The first data line 1021 and the second data line 1022 in the sector 10b, and the third trace section 10221 of the second data line 1022 located between the sector 10b and the display area 10a are located in the first conductive layer 15. The third data line 1023 and the fourth data line 1024 in the sector 10b, and the first trace section 10231 of the third data line 1023 located between the sector 10b and the display area 10a are located in the second conductive layer 17. The second trace section 10232 of the third data line 1023 located between the sector 10b and the display area 10a is located in the fourth conductive layer 24.

The following description describes a planar layout of the second pixel circuit 1013 and signal lines electrically connected to the second pixel circuit 1013 in FIG. 4 with reference to specific film stack structure of the display panel shown in FIG. 5. According to principle of mirror symmetry, planar layouts of the third pixel circuit 1014, the first pixel circuit 1012, and the fourth pixel circuit 1015 can be known.

The first semiconductor layer 13 is an active layer forming the first transistor T1, the second transistor T2, the fifth transistor T5, the sixth transistor T6, and the seventh transistor T7. A material for preparing the first semiconductor layer 13 is low-temperature polysilicon.

Figure 6A:
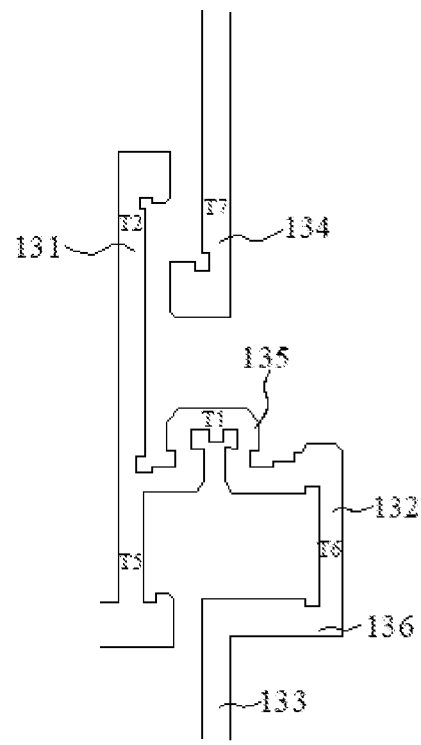
FIGS. 6A-6J are schematic diagrams of film stacking of a pixel circuit of a sub-pixel shown in FIG. 3 and a plurality of signal lines connected to the pixel circuit.

As shown in FIG. 6A, the first semiconductor layer 13 comprises a first vertical portion 131, a second vertical portion 132, a third vertical portion 133, a fourth vertical portion 134, a first horizontal extension portion 135, and a second horizontal extension portion 136. The first vertical portion 131, the second vertical portion 132, the third vertical portion 133, and the fourth vertical portion 134 extend substantially along the column direction. The first horizontal extension 135 and the second horizontal extension 136 extend substantially along the row direction.

The first horizontal extension portion 135 is connected between the first vertical portion 131 and the second vertical portion 132, the second vertical portion 132 is connected between the first horizontal extension portion 135 and the second horizontal extension portion 136, and the third vertical portion 133 is connected to one side of the second horizontal extension portion 136 away from the second vertical portion 132. The fourth vertical portion 134 is separated from the first vertical portion 131, the second vertical portion 132, the third vertical portion 133, the first horizontal extension portion 135, and the second horizontal extension portion 136. The first vertical portion 131 and the second vertical portion 132 are located at opposite edges of the pixel circuit, and the fourth vertical portion 134 is disposed adjacent to the first vertical portion 131.

The first horizontal extension portion 135 comprises a channel of the first transistor T1, the first vertical portion 131 comprises a channel of the second transistor T2 and a channel of the fifth transistor T5, the second vertical portion 132 comprises a channel of the sixth transistor T6, and the fourth vertical portion 134 comprises a channel of the seventh transistor T7.

Figure 6B:
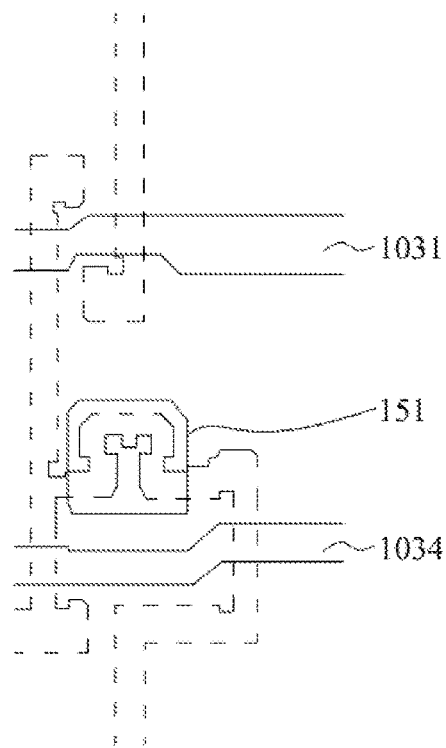

As shown in FIG. 6B, the first conductive layer 15 comprises a first scanning signal line 1031, a gate 151 of the first transistor T1, and a light-emitting control signal line 1034. Both the first scanning signal line 1031 and the light-emitting control signal line 1034 extend along the row direction, and the gate 151 of the first transistor T1 is located between the first scanning signal line 1031 and the light-emitting control signal line 1034.

The first scanning signal line 1031 comprises a gate of the second transistor T2 and a gate of the seventh transistor T7. The light-emitting control signal line 1034 comprises a gate of the fifth transistor T5 and a gate of the sixth transistor T6.

The gate 151 of the first transistor T1 overlaps the first horizontal extension portion 135. The first scanning signal line 1031 intersects with the first vertical portion 131 and the fourth vertical portion 134. The light-emitting control signal line 1034 intersects with the first vertical portion 131 and the second vertical portion 132.

Figure 6C:
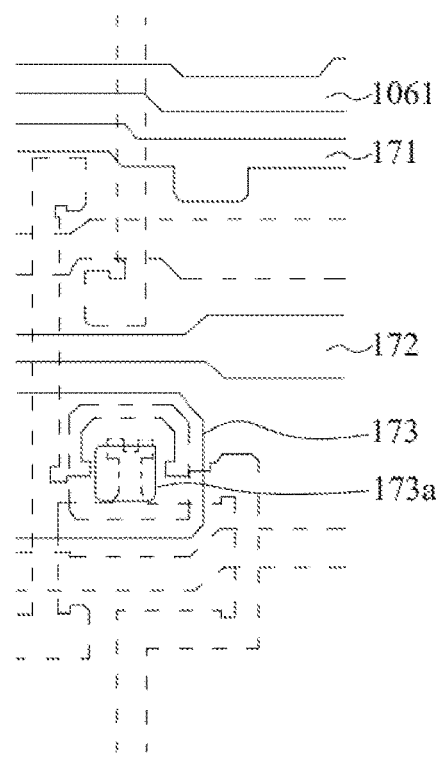

As shown in FIG. 6C, the second conductive layer 17 comprises a first initialization voltage line 1061, a third lower scanning signal line 171, a second lower scanning signal line 172, and a second electrode plate 173. The first initialization voltage line 1061, the third lower scanning signal line 171, and the second lower scanning signal line 172 all extend in the row direction, and the third lower scanning signal line 171 is located between the first initialization voltage line 1061 and the second lower scanning signal line 172. The second electrode plate 173 is located on one side of the second lower scanning signal line 172 away from the third lower scanning signal line 171.

The third lower scanning signal line 171 comprises a lower gate of the fourth transistor T4, and the second lower scanning signal line 172 comprises a lower gate of the third transistor T3.

The first initialization voltage line 1061 and the third lower scanning signal line 171 intersect with the fourth vertical portion 134. The second lower scanning signal line 172 intersects with the first vertical portion 131.

The second electrode plate 173 overlaps the gate 151 of the first transistor T1, and the gate 151 of the first transistor T1 is the first electrode plate of the first capacitor C1. An intermediate position of the second electrode plate 173 comprises an opening 173a.

Figure 6D:
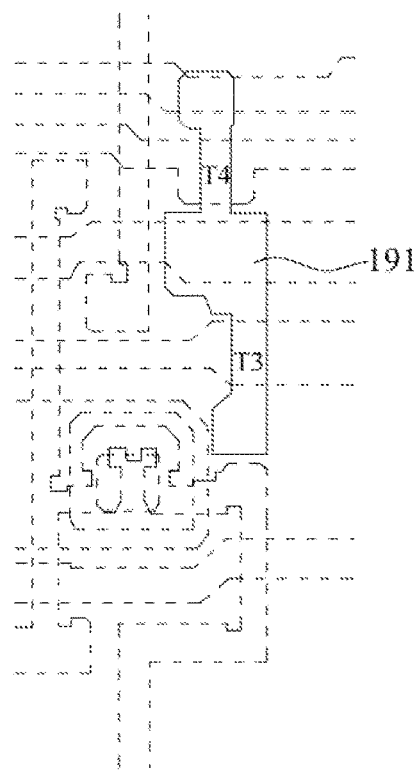

As shown in FIG. 6D, the second semiconductor layer 19 is an active layer forming the third transistor T3 and the fourth transistor T4. A preparation material of the second semiconductor layer 19 is a metal oxide including indium gallium zinc oxide.

The second semiconductor layer 19 comprises a fifth vertical portion 191 extending in the column direction. The fifth vertical portion 191 comprises a channel of the third transistor T3 and a channel of the fourth transistor T4.

The fifth vertical portion 191 intersects with the third lower scanning signal line 171 and the second lower scanning signal line 172. The fifth vertical portion 191 intersects with the first scanning signal line 1031, a portion where the fifth vertical portion 191 overlaps the first scanning signal line 1031 is the third electrode plate of the second capacitor C2, and a portion where the first scanning signal line 1031 overlaps the fifth vertical portion 191 is the fourth electrode plate of the second capacitor C2.

Figure 6E:
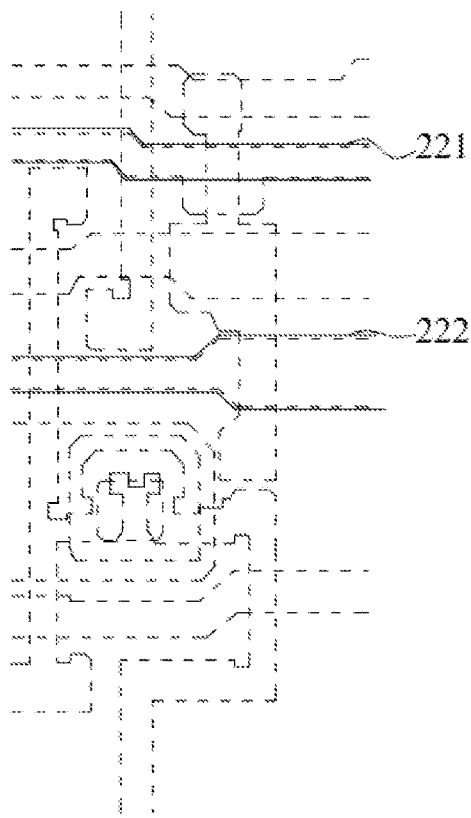

As shown in FIG. 6E, the third conductive layer 22 comprises a third upper scanning signal line 221 and a second upper scanning signal line 222, and both the third upper scanning signal line 221 and the second upper scanning signal line 222 extend along the row direction.

The third upper scanning signal line 221 disposed corresponding to the third lower scanning signal line 171, and the third upper scanning signal line 221 overlaps the third lower scanning signal line 171. The third upper scanning signal line 221 is electrically connected to the corresponding third lower scanning signal line 171, and the third upper scanning signal line 221 and the corresponding third lower scanning signal line 171 together form the third scanning signal line 1033.

The second upper scanning signal line 222 is disposed corresponding to the second lower scanning signal line 172, and the second upper scanning signal line 222 overlaps the second lower scanning signal line 172. The second upper scanning signal line 222 is electrically connected to the corresponding second lower scanning signal line 172, and the second upper scanning signal line 222 and the corresponding second lower scanning signal line 172 together form the second scanning signal line 1032.

The third upper scanning signal line 221 comprises an upper gate of the fourth transistor T4, and the second upper scanning signal line 222 comprises an upper gate of the third transistor T3.

Both the third upper scanning signal line 221 and the second upper scanning signal line 222 intersect with the fifth vertical portion 191.

Figure 6F:
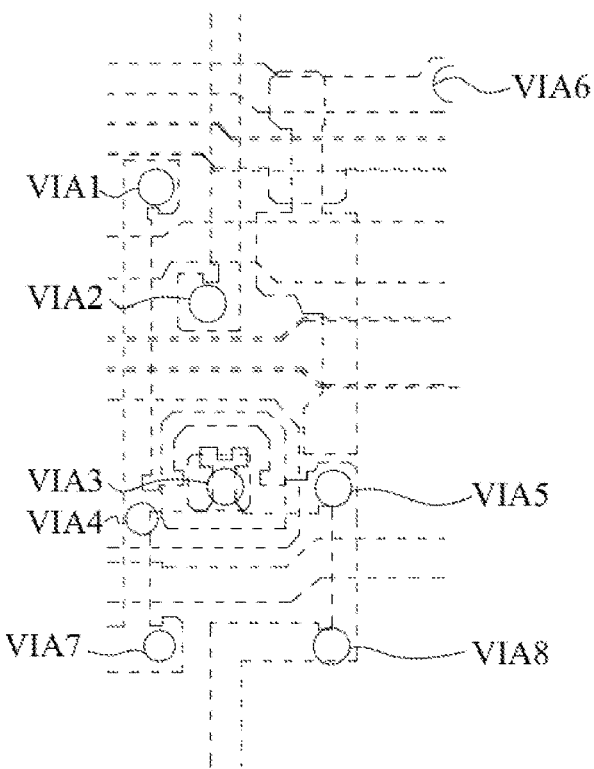

As shown in FIG. 6F, the display panel 10 comprises contact holes from a first contact hole VIA1 to an eighth contact hole VIA8 for overlapping the fourth conductive layer 24 with at least one of the first semiconductor layer 13, the first conductive layer 15 and the second conductive layer 17.

The first contact hole VIA1 exposes a portion of the first vertical portion 131. The first electrode of the second transistor T2 and a first lead 241 of the fourth conductive layer 24 which will be mentioned below are electrically connected through the first contact hole VIA1. The first contact hole VIA1 penetrates through the first insulating layer 14 to the fifth insulating layer 23.

The second contact hole VIA2 exposes a portion of the fourth vertical portion 134. The second electrode of the seventh transistor T7 and a second initialization voltage line 1062 of the fourth conductive layer 24 which will be mentioned below are electrically connected through the second contact hole VIA2. The second contact hole VIA2 penetrates through the first insulating layer 14 to the fifth insulating layer 23.

The third contact hole VIA3 is disposed corresponding to the opening 173a. The gate 151 of the first transistor T1 and a second lead 242 in the fourth conductive layer 24 which will be mentioned below are electrically connected through the third contact hole VIA3 and the opening 173a. The third contact hole VIA3 penetrates through the first insulating layer 14 to the fifth insulating layer 23.

The fourth contact hole VI4 exposes a portion of the second electrode plate 173. The second electrode plate 173 and a third lead 243 in the fourth conductive layer 24 which will be mentioned below are electrically connected through the fourth contact hole VI4. The third lead 243 transmits the first power supply voltage VDD, so that the second electrode plate 173 is connected to the first power supply voltage VDD. The fourth contact hole VI4 penetrates through the third insulating layer 18 to the fifth insulating layer 23.

The fifth contact hole VI5 exposes a portion of the first horizontal extension portion 135. The second electrode of the first transistor T1 and a fourth lead 244 in the fourth conductive layer 24 which will be mentioned below are electrically connected through the fifth contact hole VI5. The fifth contact hole VI5 penetrates through the first insulating layer 14 to the fifth insulating layer 23.

The sixth contact hole VI6 exposes a portion of the first initialization voltage line 1061. The first initialization voltage line 1061 and a fifth lead 245 in the fourth conductive layer 24 which will be mentioned below are electrically connected through the sixth contact hole VI6 to transmit the first initialization voltage Vi1 transmitted by the first initialization voltage line 1061 to the fifth lead 245. The sixth contact hole VI6 penetrates through the second insulating layer 16 to the fifth insulating layer 23.

The seventh contact hole VI7 exposes a portion of the first vertical portion 131. The first electrode of the fifth transistor T5 and a third lead 243 in the fourth conductive layer which will be mentioned below are electrically connected through the seventh contact hole VI7, so that the first electrode of the fifth transistor T5 is connected to the first supply voltage VDD. The seventh contact hole VI7 penetrates through the first insulating layer 14 to the fifth insulating layer 23.

The eighth contact hole VI8 exposes a portion of the second horizontal extension portion 136. The second electrode of the sixth transistor T6 and a sixth lead 246 in the fourth conductive layer 24 which will be mentioned below are electrically connected through the eighth contact hole VI8.

Figure 6G:
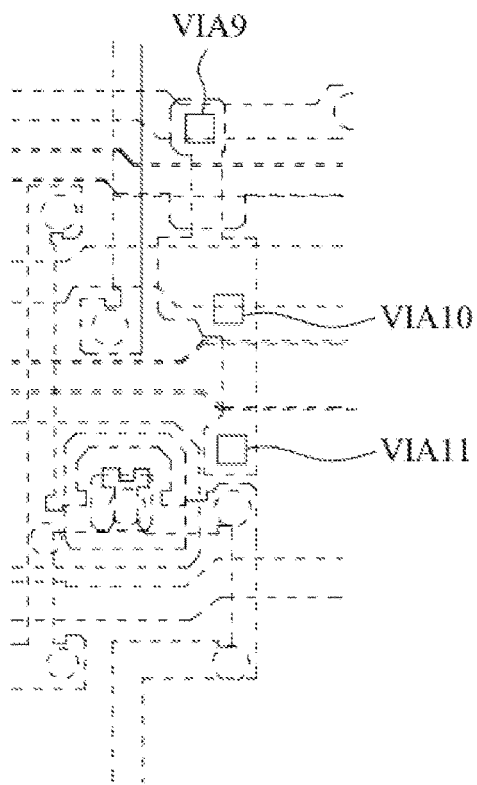

As shown in FIG. 6G, the display panel 10 comprises contact holes from a ninth contact hole VIA9 to an eleventh contact hole VIA11 for overlapping the fourth conductive layer 24 with the second semiconductor layer 19.

The ninth contact hole VIA9 exposes the fifth vertical portion 191. The second electrode of the fourth transistor T4 and a second initialization voltage line 1062 in the fourth conductive layer 24 which will be mentioned below are electrically connected through the ninth contact hole VIA9.

The tenth contact hole VIA10 exposes the fifth vertical portion 191. A second lead 242 in the fourth conductive layer 24 which will be mentioned below is electrically connected to the first electrode of the fourth transistor T4 and the first electrode of the third transistor T3 through the tenth contact hole VIA10, so that the second lead 242 bridges the gate 151 of the first transistor T1 and the first electrode of the fourth transistor T4 and the first electrode of the third transistor T3.

The eleventh contact hole VIA11 exposes the fifth vertical portion 191. A fourth lead 244 in the fourth conductive layer 24 which will be mentioned below is electrically connected through the eleventh contact hole VIA11, so that the fourth lead 244 bridges the second electrode of the first transistor T1 and the second electrode of the third transistor T3.

Figure 6H:
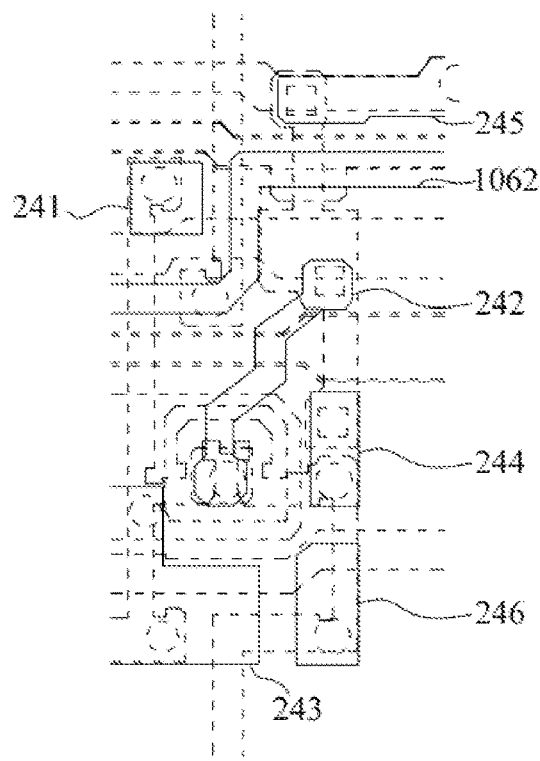

As shown in FIG. 6H, the fourth conductive layer 24 comprises leads from a first lead 241 to a sixth lead 246 and a second initialization voltage line 1062.

The second initialization voltage line 1062 extends along the row direction and intersects with the fourth vertical portion 134, the first vertical portion 131, and the fifth vertical portion 191.

The first lead 241 overlaps the first vertical portion 131. The second lead 242 is disposed obliquely, one end of the second lead 242 overlaps the fifth vertical portion 191, the other end of the second lead 242 overlaps the gate of the first transistor T1, and one end of the second lead 242 is disposed opposite to the other end of the second lead 242. The third lead 243 has an L-shaped block shape, and overlaps the second electrode plate 173 and the first vertical portion 131. The fourth lead 244 overlaps the fifth vertical portion 191 and the first horizontal extension portion 135. The fifth lead 245 overlaps the first initialization voltage line 1061. The sixth lead 246 overlaps the second horizontal extension portion 136.

Figure 6I:
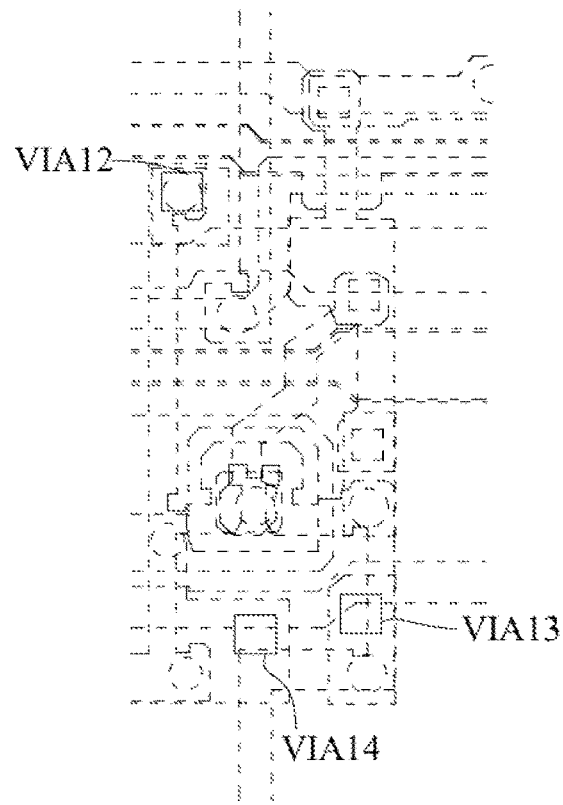

As shown in FIG. 6I, the first planarization layer 25 comprises contact holes from a twelfth contact hole VIA12 to a fourteenth contact hole VIA14 for overlapping the fourth conductive layer 24 and the fifth conductive layer 26.

The twelfth contact hole VIA12 is disposed to overlap the first lead 241. The twelfth contact hole VIA12 is used to electrically connect the first lead 241 and the data line 102 of the fifth conductive layer 26 which will be mentioned below, so that the first electrode of the second transistor T2 is electrically connected to the data line 102.

The thirteenth contact hole VIA13 is disposed to overlap the sixth lead 246. The thirteenth contact hole VIA13 is used to electrically connect the sixth lead 246 and the seventh lead 261 of the fifth conductive layer 26 which will be mentioned below, so that the seventh lead 261 is electrically connected to the second electrode of the sixth transistor T6.

The fourteenth contact hole VIA14 is disposed to overlap the third lead 243. The fourteenth contact hole VIA14 is used to electrically connect the third lead 243 and the first power supply voltage line 104 which will be mentioned below, so that the third lead 243 is input with the first power supply voltage VDD.

Figure 6J:
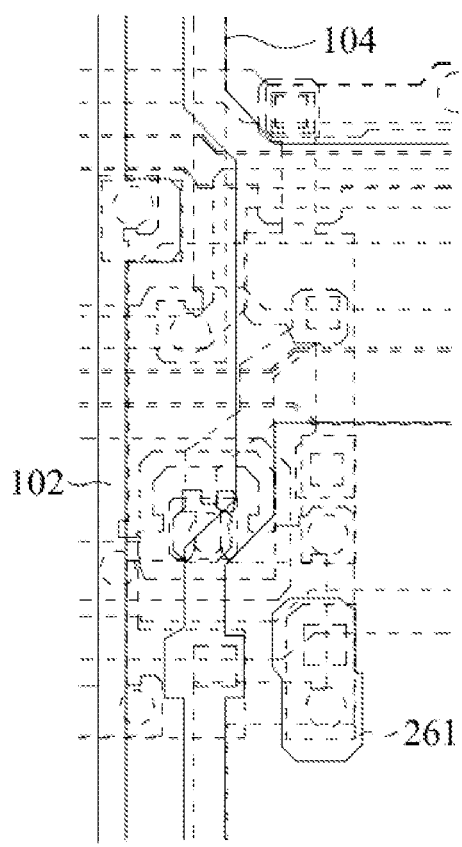

As shown in FIG. 6J, the fifth conductive layer comprises a first power supply voltage line 104, a data line 102, and a seventh lead 261. Both the first power supply voltage line 104 and the data line 102 extend along the column direction.

The data line 102 overlaps the first vertical portion 131. The first power supply voltage line 104 overlaps the fifth vertical portion 191, the third lead 243, and the like. The seventh lead 261 is disposed to overlap the sixth lead 246.

The description of the above embodiments is merely intended to help understand the technical solutions and core ideas of the present application. A person skilled in the art shall understand that it is possible to modify the technical solutions described in the foregoing embodiments, or to equivalently substitute some of the technical features thereof. These modifications or substitutions do not depart the nature of the corresponding technical solutions from the technical solutions in embodiments of the present application.

What is claimed is:

1. A display panel, wherein the display panel includes a display area and a binding area, and the display panel comprises:
a first data line extending from the display area to the binding area and being electrically connected to a first column of sub-pixels of the display area;
a second data line extending from the display area to the binding area and being located on one side of the first data line and being electrically connected to a second column of sub-pixels of the display area, wherein the second column of sub-pixels is located on one side of the first column of sub-pixels;
a third data line extending from the display area to the binding area and being electrically connected to a third column of sub-pixels of the display area, wherein the second column of sub-pixels is located between the first column of sub-pixels and the third column of sub-pixels, the second data line is located between the first data line and the third data line in the display area, and a spacing between the first data line and the second data line is less than a spacing between the third data line and the second data line;
a first pad disposed in the binding area and located on one side of the second data line and the third data line close to the first data line, wherein the first pad is electrically connected to the first data line;
a second pad disposed in the binding area and electrically connected to the third data line;
a third pad disposed in the binding area and electrically connected to the second data line, wherein the second pad is located between the first pad and the third pad in a direction perpendicular to the display area pointing to the binding area; and
a source driver chip connected to the first pad, the second pad, and the third pad;
wherein the display panel further includes a sector area located between the display area and the binding area;
the third data line intersects the second data line in an area between the sector area and the display area; and
in the sector, the third data line is located between the second data line and the first data line;
the display panel further comprises:
a first pixel circuit located in the display area and electrically connected to the first data line;
a second pixel circuit located in the display area and electrically connected to the second data line; and
a third pixel circuit located in the display area and electrically connected to the third data line;
wherein in the display area, at least a portion of the first pixel circuit is located on one side of the first data line away from the second data line, and at least a portion of the second pixel circuit and at least a portion of the third pixel circuit are located between the second data line and the third data line.

2. The display panel according to claim 1, wherein in an area between the display area and the sector area, one of the second data line and the third data line comprises a first trace section and a second trace section, the second trace section and the first trace section are located in different metal layers and are electrically connected, another of the second data line and the third data line comprises a third trace section, the third trace section and the second trace section are located in different metal layers, and the third trace section and the second trace section are electrically insulated and intersected; and
wherein, in a thickness direction of the display panel, the second trace section and the third trace section are respectively located on opposite sides of the first trace section.

3. The display panel according to claim 2, wherein the display panel further comprises a substrate, and the third trace section is located between the first trace section and the substrate.

4. The display panel according to claim 3, wherein the display panel further comprises:
a fourth data line extending from the display area to the binding area, wherein the fourth data line is electrically connected to a fourth column of sub-pixels of the display area, the fourth column of sub-pixels is located on one side of the third column of sub-pixels away from the second column of sub-pixels, the fourth data line is located on one side of the second data line and the third data line away from the first data line, and a spacing between the fourth data line and the third data line in the display area is less than a spacing between the third data line and the second data line; and
a fourth pad disposed in the binding area and located on one side of the third pad away from the second pad, wherein the fourth pad is electrically connected to the fourth data line and is connected to the source driver chip.

5. The display panel according to claim 4, wherein in a thickness direction of the display panel, the first data line and the second data line in the sector are located in a same layer and are made of a same material; and
in the thickness direction of the display panel, the third data line and the fourth data line in the sector are located in a same layer and are made of a same material.

6. The display panel according to claim 4, wherein in the display area, the first data line, the second data line, the third data line, and the fourth data line are disposed in a same layer and prepared from a same material.

7. The display panel according to claim 6, wherein in a thickness direction of the display panel, the first data line, the second data line, the third data line, and the fourth data line located in the display area are located on one side of the second trace section away from the substrate.

8. The display panel according to claim 1, wherein in the sector area, a spacing between the first data line and the third data line is equal to a spacing between the third data line and the second data line.

9. A display panel, wherein the display panel includes a display area and a binding area, and the display panel comprises:
a first data line extending from the display area to the binding area and being electrically connected to a first column of sub-pixels of the display area;
a second data line extending from the display area to the binding area and being located on one side of the first data line and being electrically connected to a second column of sub-pixels of the display area, wherein the second column of sub-pixels is located on one side of the first column of sub-pixels;
a third data line extending from the display area to the binding area and being electrically connected to a third column of sub-pixels of the display area, wherein the second column of sub-pixels is located between the first column of sub-pixels and the third column of sub-pixels, the second data line is located between the first data line and the third data line in the display area, and a spacing between the first data line and the second data line is less than a spacing between the third data line and the second data line;

a first pad disposed in the binding area and located on one side of the second data line and the third data line close to the first data line, wherein the first pad is electrically connected to the first data line;

a second pad disposed in the binding area and electrically connected to the third data line;

a third pad disposed in the binding area and electrically connected to the second data line, wherein the second pad is located between the first pad and the third pad in a direction perpendicular to the display area pointing to the binding area; and a source driver chip connected to the first pad, the second pad, and the third pad.

10. The display panel according to claim 9, wherein the display panel further includes a sector area located between the display area and the binding area, the third data line intersects the second data line in an area between the sector area and the display area; and in the sector, the third data line is located between the second data line and the first data line.

11. The display panel according to claim 10, wherein in an area between the display area and the sector area, one of the second data line and the third data line comprises a first trace section and a second trace section, the second trace section and the first trace section are located in different metal layers and are electrically connected, another of the second data line and the third data line comprises a third trace section, the third trace section and the second trace section are located in different metal layers, and the third trace section and the second trace section are electrically insulated and intersected; and wherein, in a thickness direction of the display panel, the second trace section and the third trace section are respectively located on opposite sides of the first trace section.

12. The display panel according to claim 11, wherein the display panel further comprises a substrate, and the third trace section is located between the first trace section and the substrate.

13. The display panel according to claim 12, wherein the display panel further comprises:

a fourth data line extending from the display area to the binding area, wherein the fourth data line is electrically connected to a fourth column of sub-pixels of the display area, the fourth column of sub-pixels is located on one side of the third column of sub-pixels away from the second column of sub-pixels, the fourth data line is located on one side of the second data line and the third data line away from the first data line, and a spacing between the fourth data line and the third data line in the display area is less than a spacing between the third data line and the second data line; and a fourth pad disposed in the binding area and located on one side of the third pad away from the second pad, wherein the fourth pad is electrically connected to the fourth data line and is connected to the source driver chip.

14. The display panel according to claim 13, wherein in a thickness direction of the display panel, the first data line and the second data line in the sector are located in a same layer and are prepared from a same material; and in the thickness direction of the display panel, the third data line and the fourth data line in the sector are located in a same layer and are prepared from a same material.

15. The display panel according to claim 13, wherein in the display area, the first data line, the second data line, the third data line, and the fourth data line are disposed in a same layer and prepared from a same material.

16. The display panel according to claim 15, wherein in a thickness direction of the display panel, the first data line, the second data line, the third data line, and the fourth data line located in the display area are located on one side of the second trace section away from the substrate.

17. The display panel according to claim 10, wherein in the sector area, a spacing between the first data line and the third data line is equal to a spacing between the third data line and the second data line.

18. The display panel according to claim 9, wherein the display panel further comprises:

a first pixel circuit located in the display area and electrically connected to the first data line;

a second pixel circuit located in the display area and electrically connected to the second data line; and a third pixel circuit located in the display area and electrically connected to the third data line;

wherein in the display area, at least a portion of the first pixel circuit is located on one side of the first data line away from the second data line, and at least a portion of the second pixel circuit and at least a portion of the third pixel circuit are located between the second data line and the third data line.

19. The display panel according to claim 18, wherein in the display area, the first pixel circuit and the second pixel circuit are disposed symmetrically about a center line between the first data line and the second data line, and the second pixel circuit and the third pixel circuit are disposed symmetrically about a center line between the second data line and the third data line.

20. The display panel according to claim 18, wherein the second pixel circuit and the third pixel circuit share a power supply signal line, and the power supply signal line shared by the second pixel circuit and the third pixel circuit is located between the second data line and the third data line.

* * * * *